United States Patent [19]

Coburn et al.

[11] 4,162,185

[45] Jul. 24, 1979

[54] UTILIZING SATURATED AND UNSATURATED HALOCARBON GASES IN PLASMA ETCHING TO INCREASE ETCH OF SIO₂ RELATIVE TO SI

[75] Inventors: John W. Coburn; Harold F. Winters, both of San Jose, Calif.

[73] Assignee: International Business Machines Corporation, Armonk, N.Y.

[21] Appl. No.: 888,882

[22] Filed: Mar. 21, 1978

[51] Int. Cl.² .............................................. C23F 1/00
[52] U.S. Cl. .................................... 156/643; 156/646; 156/657; 156/662; 204/192 E; 252/79.1
[58] Field of Search ............... 252/79.1; 156/643, 646, 156/657, 662; 204/192 E

[56] References Cited

U.S. PATENT DOCUMENTS

| | | | |
|---|---|---|---|
| 3,791,684 | 2/1974 | Muto | 252/79.1 |
| 3,806,365 | 4/1974 | Jacob | 134/1 |
| 3,867,216 | 2/1975 | Jacob | 252/79.1 |
| 3,923,568 | 12/1975 | Bersin | 252/79.1 |
| 3,940,506 | 2/1976 | Heinecke | 156/643 |
| 3,975,252 | 8/1976 | Fraser et al. | 204/192 E |
| 3,984,301 | 10/1976 | Matsuzaki et al. | 204/192 E |
| 4,007,104 | 2/1977 | Smummers et al. | 204/192 E |
| 4,012,307 | 3/1977 | Phillips | 204/192 E |
| 4,026,742 | 5/1977 | Fujino | 156/643 |
| 4,028,155 | 6/1977 | Jacob | 156/643 |

OTHER PUBLICATIONS

Harder et al, "Gas Mixture Control . . . Etch" *IBM Technical Disclosure Bulletin* vol. 21, No. 4 (9/78) p. 1518.
Coburn et al, "Some Aspects . . . Compounds" *IBM Research Report* Sep. 1978 pp. 1-30.
Heinecke, "Plasma Reactor . . . on Si", *Solid-State Electronics*, 1976, vol. 19 pp. 1039-1040.
Heinecke, "Control of Relative . . . Etching," *Solid-State Electronics*, 1975, vol. 18, pp. 1146 ∝ 1147.
Matsuo et al, "Preferential . . . Sputter Etching" *Japanese Journal of Applied Physics*, vol. 16, (1977/Jan.) No. 1 pp. 175-176.
Coburn, "Increasing . . . to Si;38 *IBM Technical Disclosure Bulletin, vol. 20, No. 2, (Jul. 1977) p. 757.*
Coburn, "Increasing . . . Etching" *IBM Technical Disclosure Bulletin, vol. 19, No. 10 (Mar. 1977) p. 3854.*
Coburn, "Mixtures . . . Etching" *IBM Technical Disclosure Bulletin, vol. 20, No. 11B (Apr. 1978) p. 4922.*

*Primary Examiner*—Jerome W. Massie
*Attorney, Agent, or Firm*—Joseph E. Kieninger

[57] ABSTRACT

A method of plasma etching silica at a faster rate than silicon involves using a gaseous mixture containing an unsaturated halocarbon and a saturated halocarbon. The preferred halocarbon contains fluorine. A preferred embodiment is a gaseous mixture containing $C_3F_6$ and $C_2F_6$.

9 Claims, 1 Drawing Figure

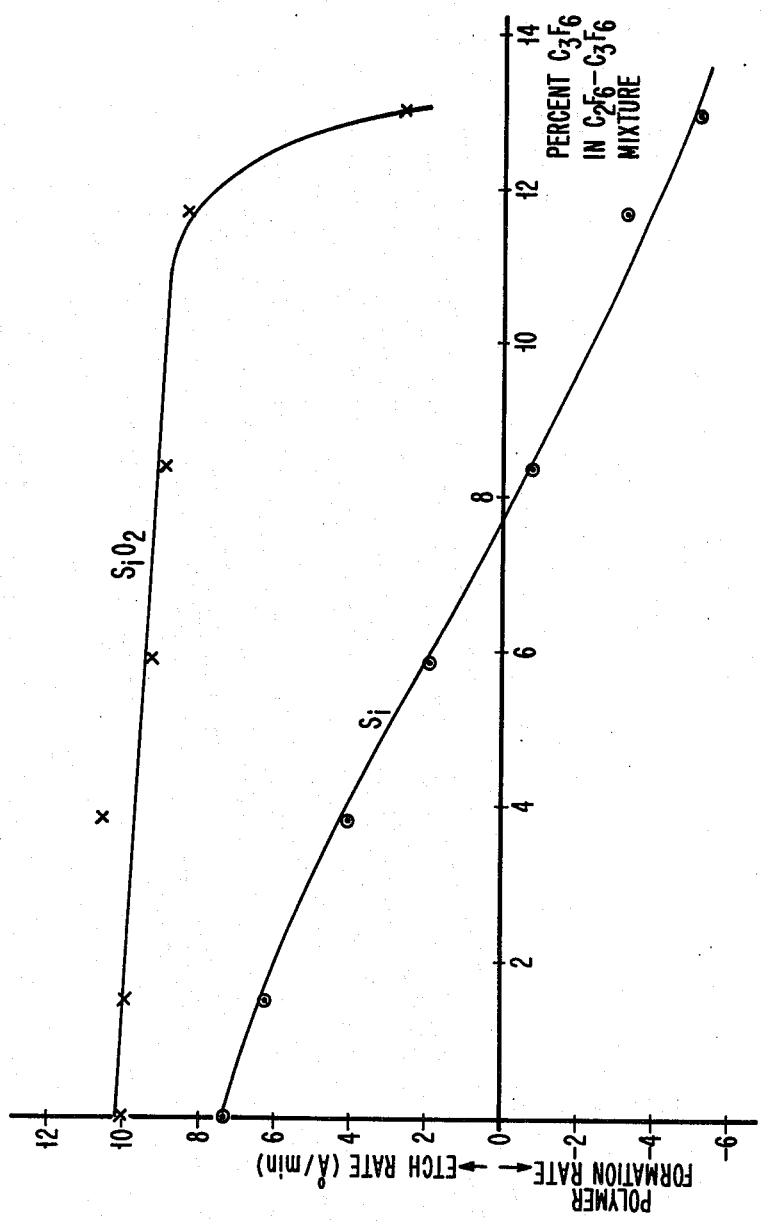

UTILIZING SATURATED AND UNSATURATED HALOCARBON GASES IN PLASMA ETCHING TO INCREASE ETCH OF SIO₂ RELATIVE TO SI

DESCRIPTION

Technical Field

This invention relates to plasma etching and more particularly to plasma etching with a gaseous mixture containing an unsaturated halocarbon and a saturated halocarbon.

It is a primary object of this invention to provide an improved gas system for plasma etching.

It is a further object to provide a gas system for plasma etching that etches SiO₂ at a faster rate than Si.

It is another object of this invention to provide a hydrogen free gas system for plasma etching.

It is still another object of this invention to provide a two gas system for plasma etching.

It is yet still another object of this invention to provide a gas system suitable for easy adjustment of the halogen/carbon ratio.

DESCRIPTION OF THE PRIOR ART

Plasma etching has been recently evaluated for semiconductor processing since it promises a number of advantages over wet chemical methods in terms of terms of improved yield and resolution at lower cost. Specifically, plasma etching is used to form a window through silica (SiO₂) films on silcon (Si) substrates. In this type of etching it is desirable for the etchant to have a high etch rate in SiO₂ relative to the etch rate of Si substrates. Most etchants used in plasma etching, however, etch SiO₂ at a rate that is not substantially different from the etch rate of Si.

One approach to increasing the relative etch rate of SiO₂ to Si was described in the patent to Heinecke U.S. Pat. No. 3,940,506. Heinecke modified the gas supplied to the plasma so as to reduce the concentration of fluorine atoms. One way Heinecke achieved this reduced concentration of fluorine atoms was to add hydrogen to the supply of carbon tetrafluoride. Another approach was to add hydrogen in the form of a chemical compound such as ammonia. Heinecke stated that the presence of a hydrogen reduced the etch rate of Si much more than the etch rate of SiO₂.

In Solid State Electronics, 1975, Vol. 18, pp 1146–1147 (printed in Great Britain) Heinecke describes the use of plasma etching with C₃F₈ as the etchant in order to increase the relative etch rate of SiO₂/Si. In Solid State Electronics, 1976, Vol. 19, pp 1039–1040 (printed in Great Britain) Heincke describes the use of a single gas such as C₄F₈, C₅F₁₂, C₂F₆ and CHF₃ as a single gas etchant to be used in plasma etching. In the Japan J. Appl. Phys. Vol. 16 (1977), No. 1, Matsuo et al describes the use of a mixture of CF₄ and C₂H₄ for plasma etching. Matsuo reported that this gas mixture etches SiO₂ faster than Si.

BRIEF DESCRIPTION OF THE DRAWINGS

The FIGURE is a figure illustrating the relative etch rates of SiO₂ and Si in a C₃F₆—C₂F₆ mixture.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

Accordingly, the invention includes the use of etching with a plasma from a gaseous mixture containing an unsaturated halocarbon and a saturated halocarbon. The preferred halogen is fluorine. A preferred embodiment is a gas mixture containing C₃F₆ and C₂F₆ gas.

BEST MODE FOR CARRYING OUT THE INVENTION

We first describe a description of the processes embodying the invention in preferred forms.

An apparatus suitable for performing the etching process consists essentially of four items; a bell jar system, a gas train for leaking gases or mixtures of gases into the bell jar, an RF generator for sustaining a plasma within the bell jar, and a vacuum pump. Any conventional plasma generating system may be employed and the electrode may be either within the system or a coil surrounding the outside of the system. The excitation power is delivered by an r.f. generator that capacitively applies the power to the plasma. A power of 50 to 150 watts, that is between ½ and 1½ watts per square centimeter is an example thereof. The frequency of the applied voltages is of the order of 13.56 MHz. Direct current may also be used. Both the power and the frequency can be varied over broad ranges as is well known to those skilled in the art.

In accordance with this invention, the plasma etching is effected by passing a mixture of gases through the etching chamber. The mixture of gases include an unsaturated halocarbon and a saturated halocarbon. While both the saturated and unsaturated halocarbon may contain fluorine, bromine and/or iodine, the preferred gaseous components contain fluorine or mixtures of fluorine with another halide. In other words, the unsaturated halocarbon may contain only one halogen or it may contain a mixture of two or more halogens, for example, C₃F₆, C₃F₄Cl₂, C₃F₂Cl₂Br₂, and so forth. Similarly, the saturated halocarbon may contain only one halogen or a mixture of two or more halogens, for example, CF₄, CF₃Cl, CF₂ClBr, and so forth. Specific examples of preferred unsaturated halocarbons are C₃F₆ and C₂F₄. Examples of preferred saturated halocarbons are CF₄ and C₂F₆.

Preferably the gaseous mixture contains a single unsaturated halocarbon and a single saturated halocarbon. While it is possible to use more than the two gases set forth above, the halogen/carbon ratio is easier to adjust in a two component system, however, more than two gases may be used if desired. The preferred halogen/carbon ratio needs to be determined experimentally for each particular system in order to find the preferred range since it may depend on the apparatus used. In the applicants' apparatus with unsaturated halocarbons containing fluorine, the preferred halogen/carbon ratio is between 2 and 3.

EXAMPLE 1

In a plasma etching system in which the total pressure was 20 millitorr, the unsaturated gas C₃F₆ was mixed with the saturated gas C₂F₆ to provide a flow rate of about 2.6 cm³/min. The generator delivered 13.5 MHz rf power which resulted in a 100 watts being applied. The excitation electrode area was 185 cm². The data set forth below show a comparison between the etch rate of SiO₂ and Si in A/minute as the percentage of the unsaturated component $C_3F_6$ is increased in the gaseous mixture. The etch rate with 0% $C_3F_6$ was 7.3 for Si and 10.0 for $SiO_2$. At a concentration of 5.9% $C_3F_6$ the etch rate of Si had gone down to 2.0 whereas the etch rate of $SiO_2$ was 9.3. For concentrations of 8.4 to 13.0, the Si had a negative etch rate, that is, a polymer formation occurred on the wafer. The data are illustrated in FIG. 1 which clearly show the faster etch rate of $SiO_2$ over Si for the concentration range set forth.

| Percentage $C_3F_6$ in $C_2F_6$-$C_3F_6$ Mixture | Si Etch Rate+ (A/min) | $SiO_2$ Etch Rate+ (A/min) |
|---|---|---|
| 0 | 7.3 | 10.0 |
| 1.5 | 6.3 | 10.0 |
| 3.8 | 4.1 | 10.6 |
| 5.9 | 2.0 | 9.3 |
| 8.4 | −0.7* | 9.0 |
| 11.7 | −3.2* | 8.5 |
| 13.0 | −5.1* | 2.7 |

+Each rate measured on grounded wafers.
*A negative etch rate means polymer formation.

INDUSTRIAL APPLICABILITY

A number of different combinations of unsaturated halocarbon and saturated halocarbon may be used in the etchings of Si wafers.

EXAMPLE 2

A mixture of $C_3F_6$ and $CF_4$ was made under a total pressure of 20 millitorr. The gas flow rate was 1.6 cm$^3$/min. A power of 50 watts was applied at 13.5 MHz. The $SiO_2$ excitation electrode area was 185 cm$^2$. The following tabulation set forth the data obtained.

| Percentage of $C_3F_6$ in $CF_4$-$C_3F_6$ Mixture | Si Etch Rate+ (A/min) | $SiO_2$ Etch Rate+ (A/min) |
|---|---|---|
| 0 | 16.9 | 11.7 |
| 5.3 | 14.1 | 11.3 |
| 10.5 | 10.9 | 11.0 |
| 15.8 | 7.2 | 10.1 |
| 20.9 | 2.1 | 8.5 |
| 26.2 | −1.3* | 4.1 |
| 32.0 | −2.0* | −3.0* |

+Etch rate measured on grounded wafers.
*A negative etch rate means polymer formation.

In this system a gaseous mixture containing 20.9% $C_3F_6$ had an $SiO_2$ etch rate of 8.5 compared to a Si etch rate of 2.1 at this concentration.

EXAMPLE 3

A mixture of $C_2F_4$ and $CF_4$ having a total gas flow rate of 1.3 cm$^3$/min was used. The total pressure in the vacuum system was about 20 millitorr. A 100 watts of power was applied at 13.56 MHz. The $SiO_2$ excitation electrode area was 100 cm$^2$. The following tabulation sets forth the data obtained. The etch rate of $SiO_2$ was 21.5 and the silcon etch rate of 0.5 occurred when 45.8% $C_2F_4$ was used in the mixture.

| Percentage $C_2F_4$ in $CF_4$—$C_2F_4$ Mixture | Si Etch Rate+ (A/min) | $SiO_2$ Etch Rate+ (A/min) |
|---|---|---|
| 0 | 63.5 | 46.3 |
| 9.2 | 68.5 | 44.2 |
| 19.9 | 21.2 | 43.0 |
| 29.1 | 3.2 | 35.2 |
| 37.3 | 7.5 | 29.5 |
| 45.8 | 0.5 | 21.5 |
| 53.6 | −0.7* | −2.4* |
| 61.8 | −42.5* | −35.9* |
| 69.5 | −118.0* | −41.6* |

+Etch rate measured on grounded wafers.
*Negative etch rate means polymer formation.

While I have illustrated and described the preferred embodiment of my invention, it is understood that I do not limit myself to the precise compositions herein and the right is reserved to allow changes and modifications coming within the scope of the invention as defined in the appended claims.

We claim:
1. A method of adjusting the $SiO_2$/Si etch rate ratio in an article having both $SiO_2$ and Si in a plasma etching system comprising the steps of
   introducing a controllable flow rate of a saturated halocarbon gas into a plasma etching system,
   introducing a controllable flow rate of an unsaturated halocarbon gas into said plasma etching system to mix with the saturated hydrocarbon gas and form a plasma, and
   adjusting the relative flow rates of the saturated halocarbon and the unsaturated halocarbon gases to control the $SiO_2$/Si etch rate ratio.
2. A method as described in claim 1 whereby the relative flow rates are adjusted by increasing the flow rate of the unsaturated hydrocarbon.
3. A method as described in claim 1 whereby the saturated halocarbon gas and the unsaturated halocarbon gas are mixed together prior to being introduced into the plasma etching system.
4. A method as described in claim 1 whereby said unsaturated halocarbon is $C_3F_6$.
5. A method as described in claim 1 whereby said unsaturated halocarbon is $C_2F_4$.
6. A method as described in claim 1 whereby said unsaturated halocarbon is $C_3F_4$ and said saturated halocarbon is $CF_4$.
7. A method as described in claim 1 whereby said unsaturated halocarbon contains fluorine.
8. A method as described in claim 7 whereby said saturated halocarbon contains fluorine.
9. A method as described in claim 8 whereby the relative flow rates of the gases are adjusted so that the halogen/carbon ratio of the gaseous mixture is a value between 2 and 3.

* * * * *